(12) United States Patent
Muralimanohar et al.

(10) Patent No.: US 10,049,733 B2
(45) Date of Patent: Aug. 14, 2018

(54) REUSING SNEAK CURRENT IN ACCESSING MEMORY CELLS

(71) Applicant: HEWLETT PACKARD ENTERPRISE DEVELOPMENT LP, Houston, TX (US)

(72) Inventors: Naveen Muralimanohar, Palo Alto, CA (US); Erik Ordentlich, Palo Alto, CA (US); Yoocharn Jeon, Seoul (KR)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/500,062

(22) PCT Filed: Oct. 31, 2014

(86) PCT No.: PCT/US2014/063394
§ 371 (c)(1),
(2) Date: Jan. 30, 2017

(87) PCT Pub. No.: WO2016/068922
PCT Pub. Date: May 6, 2016

(65) Prior Publication Data
US 2017/0243642 A1    Aug. 24, 2017

(51) Int. Cl.
*G11C 13/00*    (2006.01)

(52) U.S. Cl.
CPC .......... *G11C 13/004* (2013.01); *G11C 13/003* (2013.01); *G11C 13/0007* (2013.01); *G11C 13/0069* (2013.01); *G11C 2013/0054* (2013.01)

(58) Field of Classification Search
CPC .................................................. G11C 13/0033
USPC .......................................................... 365/148
See application file for complete search history.

(56) References Cited

U.S. PATENT DOCUMENTS

| 6,597,598 B1 * | 7/2003 | Tran ...................... G11C 7/062 365/100 |
| 6,646,904 B2 * | 11/2003 | Chow ..................... G11C 11/22 365/117 |
| 7,561,461 B2 * | 7/2009 | Nagai ...................... G11C 7/02 365/148 |
| 7,898,853 B2 | 3/2011 | Lee et al. |
| 8,467,253 B2 * | 6/2013 | Perner ..................... G11O 5/063 365/148 |

(Continued)

FOREIGN PATENT DOCUMENTS

WO    2014066462    5/2014

OTHER PUBLICATIONS

International Searching Authority, The International Search Report and the Written Opinion, PCT/US2014/063394, dated Jul. 13, 2015, 10 Pages.

(Continued)

*Primary Examiner* — Son Mai
(74) *Attorney, Agent, or Firm* — Patent Law Group LLP

(57) ABSTRACT

A method to access two memory cells include determining a first cell current flowing through a first memory cell by subtracting a sneak current associated with the first memory cell from a first access current of the first bitline and determining a second cell current flowing through a second memory cell in the first bitline or a second bitline by subtracting the sneak current associated with the first memory cell from a second access current of the first bitline or the second bitline.

20 Claims, 8 Drawing Sheets

(56) References Cited

U.S. PATENT DOCUMENTS

| | | |
|---|---|---|
| 8,487,289 B2 | 7/2013 | Yang et al. |
| 8,830,734 B2 | 9/2014 | Roelofs et al. |
| 8,837,200 B2 * | 9/2014 | Tsuji ................ G11C 13/0004 365/148 |
| 8,923,032 B2 * | 12/2014 | Shimakawa ........... G11C 13/00 365/148 |
| 9,019,747 B2 * | 4/2015 | Tsuji ...................... G11C 8/08 365/148 |
| 2002/0141222 A1 | 10/2002 | Nair et al. |
| 2003/0193830 A1 | 10/2003 | Baker |
| 2008/0205179 A1 | 8/2008 | Markert et al. |
| 2014/0145140 A1 | 5/2014 | Kim |
| 2014/0233329 A1 | 8/2014 | Chen et al. |
| 2016/0180928 A1 * | 6/2016 | Kim .................... G11C 13/004 711/125 |

OTHER PUBLICATIONS

Xu, C., et al., Design Implications of Memristor-based RRAM Cross-point Structures [online], Dec. 15, 2010, EDAA, 6 Pgs.

* cited by examiner

REUSING SNEAK CURRENT IN ACCESSING MEMORY CELLS

BACKGROUND

Resistive memory is one of the emerging memory technologies that may replace dynamic random access memory (DRAM) as the main memory in computers. Resistive memory in general refers to any technology that uses varying cell resistance to store information. One type of resistive memory is metal-oxide resistive random access memory (ReRAM).

A ReRAM cell has a metal-oxide layer sandwiched between two metal electrodes. A low resistance state (LRS or ON-state) and a high resistance state (HRS or OFF-state) are used to represent the logical "1" and '0' respectively or vice versa. In order to switch a ReRAM cell, an external voltage with certain polarity, magnitude, and duration is applied to the metal oxide. The switching of LRS-to-HRS is called a reset operation and the switching of HRS-to-LRS is called a set operation.

A ReRAM-based main memory may be fabricated in a crossbar with a high cell density. In the crossbar, all ReRAM cells are interconnected to each other with nonlinear selectors instead of access transistors. The cells are directly sandwiched between wordlines and bitlines. To set a cell, the selected wordline and bitline are set to voltages V and 0 respectively. Conversely to reset a cell, the selected wordline and bitline are set to voltages 0 and V respectively.

A single cell in a crossbar may be accessed by applying the proper potential across the wordline and bitline connected to the cell. Ideally when a wordline and a bitline are activated, the entire current should flow through the cell that lies at their crossing point. However other cells in the selected wordline and bitline also see partial voltage across them. The half-selected cells in the selected wordline and bitline leak current through them due to partial write voltage across them, which is commonly referred to as a sneak current. In order to reduce the sneak current, all the other wordlines and bitlines that are not selected are half biased at V/2. This limits the voltage drop on the half-selected cells to V/2 and the voltage drop on the unselected cells to 0.

BRIEF DESCRIPTION OF THE DRAWINGS

In the drawings:

FIG. 1-3 is a circuit schematic of a sensing circuit of FIG. 1-1 or 1-2 in examples of the present disclosure;

FIG. 2 is a flowchart of a method to access two memory cells in the crossbar array of FIG. 1-1 or 1-2 by reusing the sneak current associated with one of the two memory cells in examples of the present disclosure;

FIG. 3 is a diagram illustrating voltages applied to the crossbar array of FIG. 1-1 or 1-2 to generate a sneak current through partially selected memory cells connected to a bitline in examples of the present disclosure;

Use of the same reference numbers in different figures indicates similar or identical elements.

DETAILED DESCRIPTION

Figure 1:
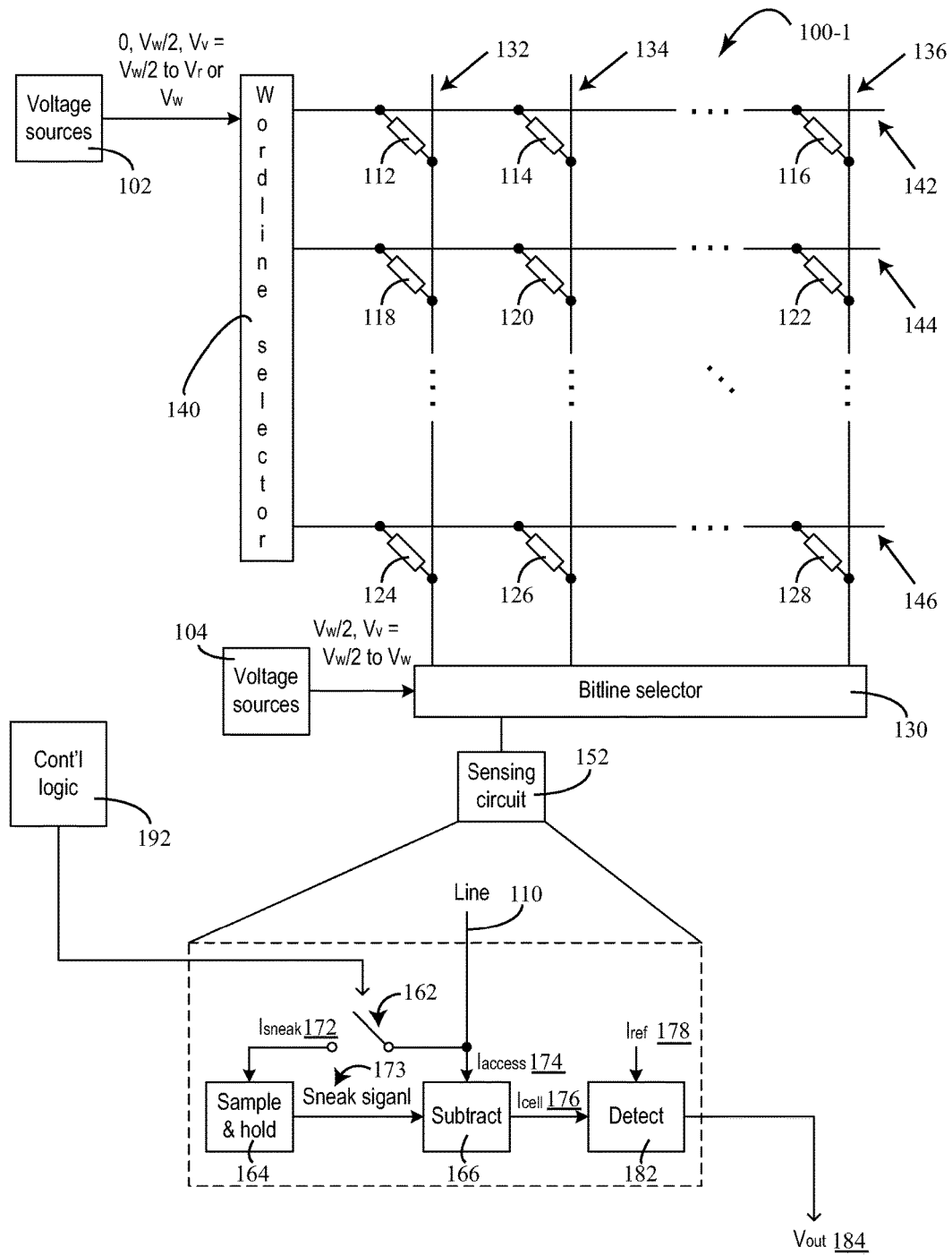
FIGS. 1-1 and 1-2 are diagrams of crossbar arrays in examples of the present disclosure.

As used herein, the term "includes" means includes but not limited to, the term "including" means including but not limited to. The terms "a" and "an" are intended to denote at least one of a particular element. The term "based on" means based at least in part on. The term "or" is used to refer to a nonexclusive or such that "A or B" includes "A but not B," "B but not A," and "A and B" unless otherwise indicated.

Resistive memory cells such as memristor cells may be arranged in a crossbar array to achieve a high density memory. A nonlinear selector is put in series with each resistive memory to reduce the sneak current in a crossbar array. The voltages applied to crossbar array may have the following relationship: $V_{th} < V_r < V_{th}, V_{switch} < V_w < 2V_{th}$ where $V_{th}$ is the threshold voltage of the nonlinear selector, $V_r$ is the read voltage applied to the memory cell, $V_{switch}$ is the switching voltage of the memory cell, and $V_w$ is the write voltage applied to the memory cell. When the memory cell is read, the selected row is biased to read voltage V, and the selected column to the ground while all the unselected rows and columns are biased to a partial select voltage equal to or less than half of write voltage $V_w$ (e.g., $V_w/2$, $V_w/3$, or $V_w/4$). Since the maximum voltage that the unselected devices in the array receive is less than half of write voltage $V_w$ (e.g., $V_w/2$) and threshold voltage $V_{th}$ of the selector is higher than half of write voltage $V_w$ (e.g., $V_w/2$), the sneak current can be reduced to the sub-threshold current of the selector. When the memory cell is written, the voltage difference between the selected row and the selected column may be increased to write voltage $V_w$.

Even when reduced to the sub-threshold current of the selector, the sneak current still makes it difficult to reliably sense the HRS and LRS of a memory cell. To address this issue, a memory cell connected to a bitline in a crossbar array may be accessed in two steps. In a read operation the first step includes sensing and storing a sneak current flowing through half-selected memory cells connected to the bitline. The second step includes sensing a read current flowing through a fully selected memory cell and half-selected memory cells connected to the bitline, determining a cell current flowing through the fully selected memory cell by subtracting the sneak current from the read current, and determining the state of the fully selected memory cell based on the cell current reaching one or more reference currents.

Similar to the read operation, in a write operation the first step also includes sensing and storing a sneak current from a bitline. The second step includes sensing a write current flowing through a fully selected memory cell and half-selected memory cell connected to the bitline, determining a cell current flowing through the fully selected memory cell by subtracting the sneak current from the write current, and determining the fully selected memory cell has been set or reset based on the cell current reaching a reference current.

In examples of the present disclosure, sneak currents of memory cells in the same bitline and nearby bitlines in a crossbar array may be similar. For example, the sneak currents may change by less than 2 micro-Amperes between the nearby memory cells despite process variation when the data stored in the crossbar array is substantially random (e.g., half 1s and half 0s). Leveraging the sneak current similarity, the sneak current estimate of one memory cell may be used as the sneak current estimate for nearby memory cells in the same bitline or nearby bitlines in order to save energy and reduce access latency by skipping the first step when accessing the nearby memory cells. The sneak current estimate of a bitline in a read process may be used as the sneak current estimate for the bitline or nearby bitlines in other read or write processes. The sneak current estimate of a bitline in a write process may be used as the sneak current estimate for the bitline or nearby bitlines in other read or write processes.

To avoid the distribution of 1's and 0's being skewed (e.g., an extreme case being one column all zeros and another column all ones), the data may be coded to have a substantially random distribution of is and Os. Furthermore the partial select voltage biasing the unselected wordlines and bitlines may be lowered to less than half the write voltage ($V_w/2$), such as to a third or a fourth of the write voltage ($V_w/3$ or $V_w/4$), to mitigate or eliminate the effects of the skewed distribution of the data. In any case, the sneak current estimate may be reused when accessing memory cells across rows that share the same bitline.

FIG. 1-1 is a diagram of a crossbar array 100-1 in examples of the present disclosure. Crossbar array 100-1 includes resistive memory cells 112, 114 . . . 116, 118, 120 . . . 122 . . . 124, 126 . . . 128, a bitline selector 130, bitlines 132, 134 . . . 136, a wordline selector 140, wordlines 142, 144 . . . 146, and a sensing circuit 152. Memory cells 112 . . . 128 include a nonlinear selector device and a resistive memory device. The resistive memory device may be a memristor. Memory cells 112, 114 . . . 116 are located at the crossing points between bitlines 132, 134 . . . 136 and wordline 142. Memory cells 118, 120 . . . 122 are located at the crossing points between bitlines 132, 134 . . . 136 and wordline 144. Memory cells 124, 126 . . . 128 are located at the crossing points between bitlines 132, 134 . . . 136 and wordline 146.

Wordline selector 140 includes decoder and driver circuits to selectively couple wordlines 142, 144 . . . 146 to ground (0 volts), $V_w/2$ or a variable voltage $V_v$ provided by voltage sources 102. Variable voltage $V_v$ increments from $V_w/2$ to a maximum read voltage $V_r$ or a maximum write voltage $V_w$.

Bitline selector 130 includes decoder and driver circuits to selectively couple bitlines 132, 134 . . . 136 to ground (0 volts), $V_w/2$ or a variable voltage $V_v$ provided by voltage sources 104. Variable voltage $V_v$ increments from $V_w/2$ to a maximum write voltage $V_w$. As the number of bitlines is more than the number of sensing circuits, bitline selector 130 also selectively couples multiple bitlines to one sensing circuit in order for many bitlines to share one sensing circuit. For example, bitline selector 130 couples bitline 132 or 134 to sensing circuit 152. Bitlines that share a sensing circuit may be considered to be nearby or proximate bitlines.

Sensing circuit 152 is shown in greater details in an enlarged view. Sensing circuit 152 has a line 110 coupled by bitline selector 130 to bitline 132 or bitline 134. Sensing circuit 152 includes a switch 162, a sample and hold circuit 164, a subtraction circuit 166, and a detection circuit 182.

Switch 162 is controlled by a control logic 192 to selectively couple line 110 to sample and hold circuit 164. When switch 162 couples line 110 to sample and hold circuit 164, sample and hold circuit 164 is to store a sneak current ($I_{sneak}$) 172 flowing through partially selected (e.g., half-selected) memory cells connected to a bitline (e.g., memory cells 114, 120 . . . 126 connected to bitline134).

Subtraction circuit 166 is coupled to line 110 to receive an access current ($I_{access}$) 174 flowing through a fully selected memory cell (e.g., memory cell 120) and partially selected memory cells (e.g., memory cells 114, 126, etc.) connected to selected bitline, e.g., 134. Subtraction circuit 166 is also coupled to receive a sneak signal 173 from sample and hold circuit 164. Sneak signal 173 may be a voltage proportional to sneak current 172 or sneak current 172 itself. Based on sneak signal 173, subtraction circuit 166 subtracts sneak current 172 from access current 174 to determine a cell current ($I_{cell}$) 176 flowing through the fully selected memory cell 120, and output cell current 176.

Detection circuit 182 is coupled to subtraction circuit 166 to receive cell current 176. Detection circuit 182 is also coupled to a reference current source to receive a reference current ($I_{ref}$) 178. Reference current 178 may be a read reference current in a read operation or a write reference current in a write operation. Control logic 192 causes detection circuit 182 to sense cell current 176. In a read operation, detection circuit 182 compares cell current 176 against (read) reference current 178 and generate an output signal ($V_{out}$) 184 that represents the logic state of the selected memory cell. In a write operation, detection circuit 182 compares cell current 176 against (write) reference current 178 and generates an output signal 184 when cell current 176 reaches (write) reference current 178.

Figures 1, 2:
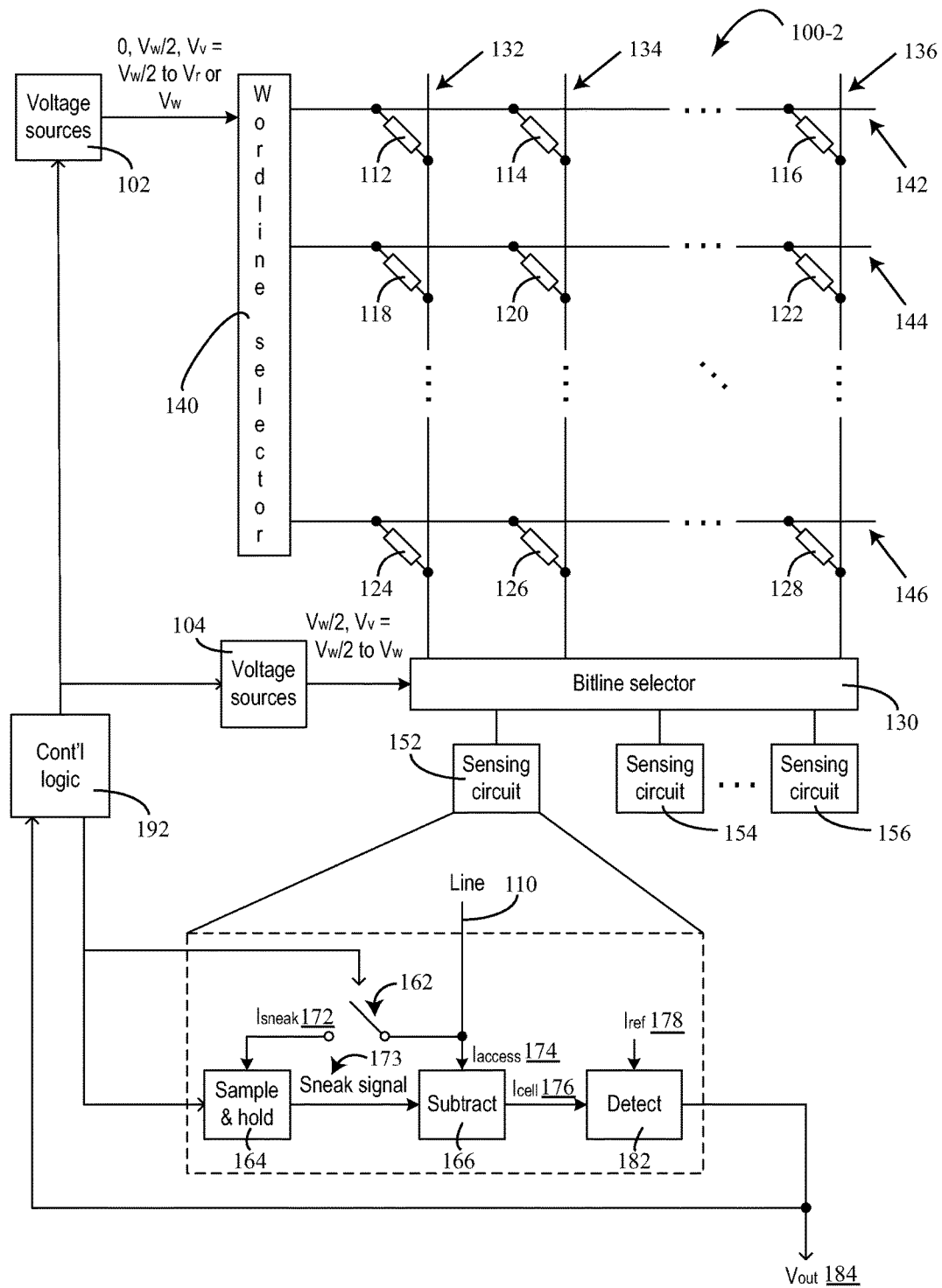

FIG. 1-2 is a diagram of a crossbar array 100-2 in examples of the present disclosure. Crossbar array 100-2 is similar to crossbar array 100-1 but further includes sensing circuits 154 . . . 156. Sensing circuits 154 . . . 156 may be similarly constructed as sensing circuit 152. Bitline selector 130 may selectively couple each of sensing circuits 154 . . . 156 to a different group of bitlines.

Control logic 192 is coupled to voltage sources 102, switch 162, sample and hold circuit 164, and detection circuit 182. Control logic 192 controls voltage sources 102 to start and stop variable voltage $V_v$, which increments from $V_w/2$ to $V_r$ in a read operation or from $V_w/2$ to $V_w$ in a write operation. Control logic 192 controls switch 162 to provide sneak current 172 associated with a memory cell in a bitline to sample and hold circuit 164. Control logic 192 also controls when sample and hold circuit 164 is to be reset. Control logic 192 may receive output signal 184 from detection circuit 182 for a write operation as described in more detail later.

Figures 1, 2, 3:
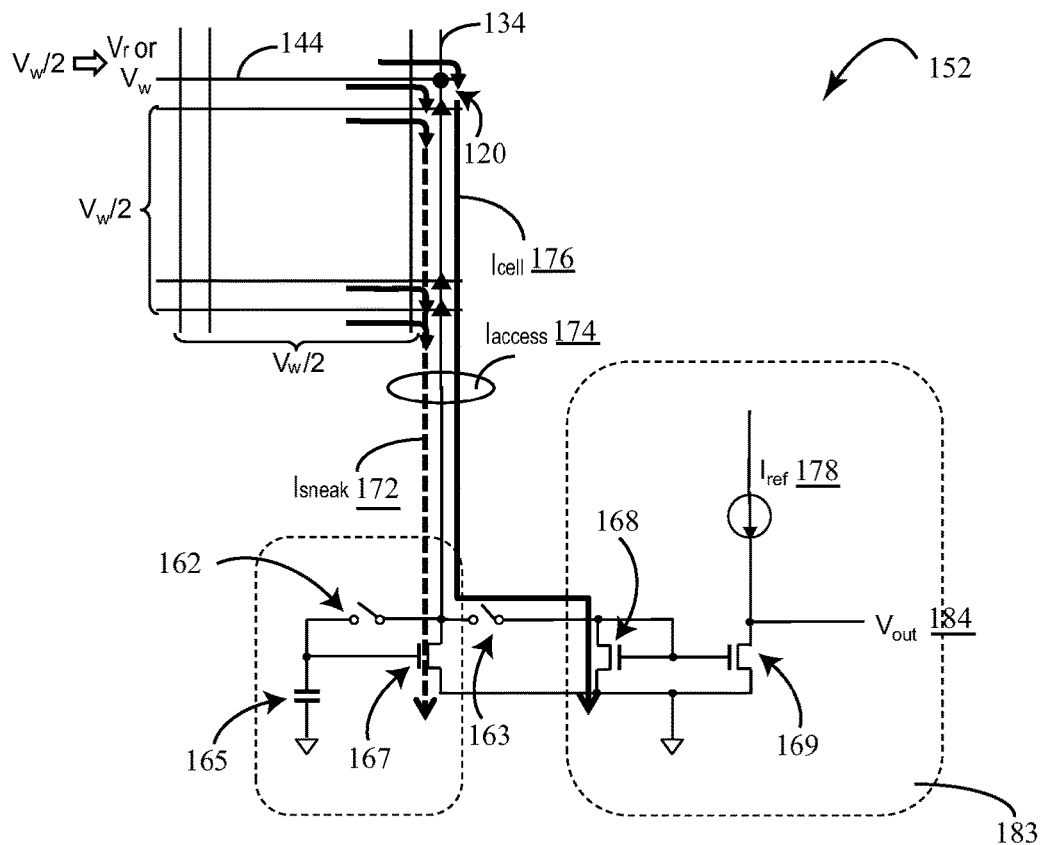
Figure 2:
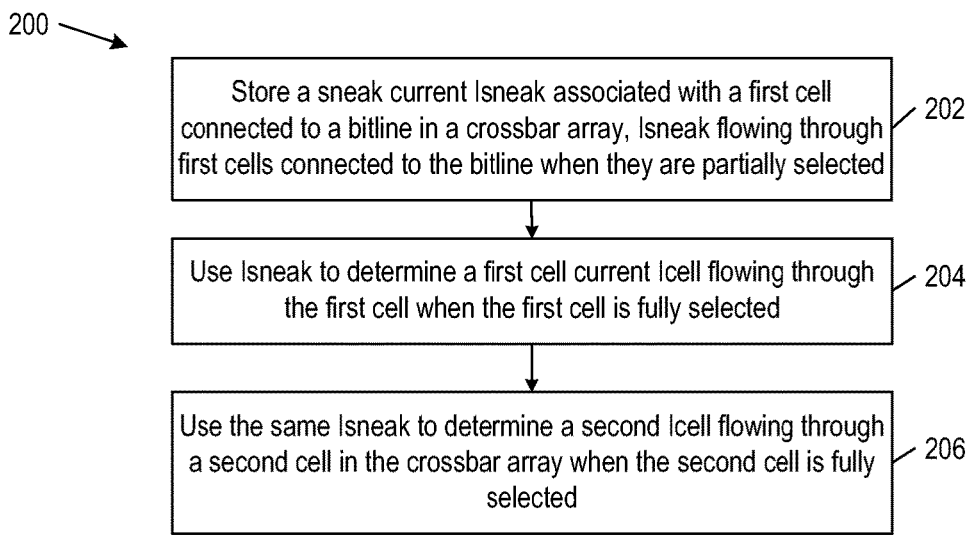
Figure 3:
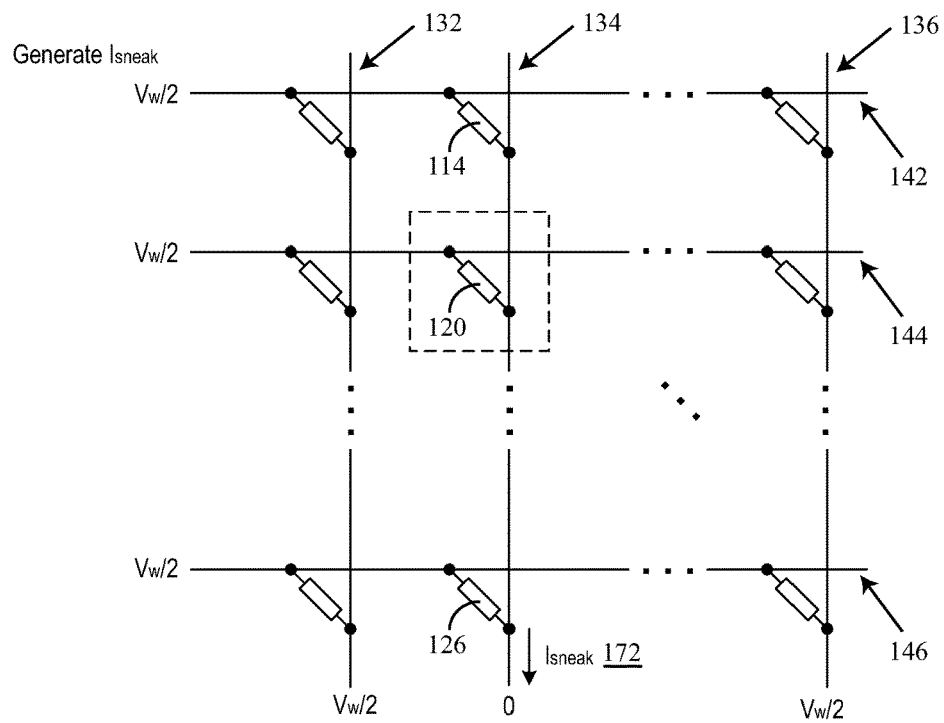

FIG. 1-3 is a circuit schematic of a sensing circuit 152 of FIG. 1-1 or 1-2 in examples of the present disclosure. Sample and hold circuit 164 (FIG. 1-1 or 1-2) is implemented with a storage capacitor 165, subtraction circuit 166 (FIG. 1-1 or 1-2) is implemented with a field-effect transistor (FET) 167 and a switch 163, and detection circuit 182 (FIG. 1-1 or 1-2) is implemented with a sense amplifier 183 selectively coupled by switch 163 to receive a cell current 176. Assume memory cell 120 is to be sensed. To sense a sneak current 172 from partially selected memory cells in bitline 134, bitline 134 is grounded and all wordlines and other bitlines are set to partial select voltage $V_w/2$. Switch 163 is opened and switch 162 is closed by control logic 192 (FIG. 1-1 or 1-2) so sneak current 172 flows down bitline 134 to storage capacitor 165. While sampling, the drain-gate connection of FET 167 develops a gate-to-source voltage $V_{gs}$ that gives drain-to-source current $I_{ds}$ corresponding to sneak current 172 and it is stored to storage capacitor 165. Once the sampling is finished, switch 162 is opened to disconnect the connection between the drain and the gate of FET 167 and the drain current will be fixed to the same current even though the drain voltage changes since the gate voltage is kept constant by storage capacitor 165.

After sneak current 172 has been captured, wordline 144 is to ramp from $V_w/2$ to $V_r$, bitline 134 remains grounded, and other wordlines and other bitlines remain at partial select voltage $V_w/2$. To sense a cell current 176, switch 163 is then closed to couple sense amplifier 183 to the drain of FET 167. As word line 144 potential is increased to read voltage $V_r$, an access current (e.g., a read current) 174 flows down from bitline 134. Access current 174 includes a cell current 176 through fully selected memory cell 120 and the previously measured sneak current 172. As all the other word lines are kept to the same partial select voltage $V_w/2$, sneak current 172 does not change. Since FET 167 drains sneak current 172 only, effectively subtracting sneak current 172 from access current 174, cell current 176 can be measured with sense amplifier 183.

Sense amplifier 183 includes a current mirror with a first FET 168 and a second FET 169. FET 168 has a drain connected to its gate and the gate of FET 169. The drain of FET 169 is connected to a current source providing a reference current ($I_{ref}$) 178. Cell current 176 turns on and flows through FET 168.

The potential of output voltage ($V_{out}$) 184 depends on the competition between the reference current $I_{ref}$ and the current flowing through FET 169, which is same as the current flowing through FET 168. When the current through FET 169 is smaller than reference current $I_{ref}$, it drive output voltage 184 high quickly. When the current through FET 169 is larger, output voltage 184 gets lowered. When reference current $I_{ref}$ is set in the middle of the currents of HRS and LRS of the selected memory cell biased by read voltage $V_r$, output voltage 184 represents the logic state of the selected memory cell.

FIG. 2 is a flowchart of a method 200 to access (read or write) two memory cells by reusing the sneak current associated with one of the two memory cells in examples of the present disclosure. To illustrate method 200 reusing the same sneak current across bitlines, assume memory cell 120 (FIG. 1-1 or 1-2) connected to bitline 134 (FIG. 1-1 or 1-2) is accessed before memory cell 124 (FIG. 1-1 or 1-2) connected to bitline 132 (FIG. 1-1 or 1-2). To illustrate method 200 reusing the same sneak current across rows that share the same bitline, assume memory cell 120 connected to bitline 134 (FIG. 1-1 or 1-2) is accessed before memory cell 126 (FIG. 1-1 or 1-2) connected to the same bitline 134. Method 200 may begin in block 202.

In block 202, sneak current 172 (FIG. 1-1 or 1-2) associated with memory cell 120 connected to bitline 134 is stored. Sneak current 172 is associated with memory cell 120 because it is sensed and stored as part of the process of accessing memory cell 120. Sneak current 172 flows through partially selected memory cells 114, 120 . . . 126 (FIG. 1-1 or 1-2) connected to bitline 134 (FIG. 1-1 or 1-2).

FIG. 3 is a diagram illustrating voltages applied to crossbar array 100-1 or 100-2 (FIG. 1-1 or 1-2) to generate sneak current 172 in examples of the present disclosure. Bitline 134 is grounded and all wordlines 142, 144 . . . 146 and other bitlines 132, 136, etc. are set to partial select voltage $V_w/2$. As a result a $V_w/2$ voltage drop across all partially selected memory cells 114, 120 . . . 126 causes sneak current 172 to flow from bitline 134.

Referring to FIG. 1-1 or 1-2, control logic 192 causes switch 162 to couple sample and hold circuit 164 to line 110, which is coupled by bitline selector 130 to bitline 134. Sample and hold circuit 164 then stores sneak current 172 from bitline 134.

Referring back to FIG. 2, block 202 may be followed by block 204.

In block 204, a cell current 176 (FIG. 1-1 or 1-2) flowing across fully selected memory cell 120 connected to bitline 134 (FIG. 1-1 or 1-2) is determined or estimated. This determined or estimated cell current is hereafter referred to as a "first cell current 176." First cell current 176 is based on sneak current 172 (FIG. 1-1 or 1-2) associated with memory cell 120 (FIG. 1-1 or 1-2) and an access current 174 (FIG. 1-1 or 1-2) flowing through fully selected memory cell 120 and partially selected memory cells 114, 126, etc. (FIG. 1-1 or 1-2) connected to bitline 134. This access current is hereafter referred to as a "first access current 174." First access current 174 may be referred to as a "first read current 174" in a read operation or a "first write current 174" in a write operation.

Figure 4:
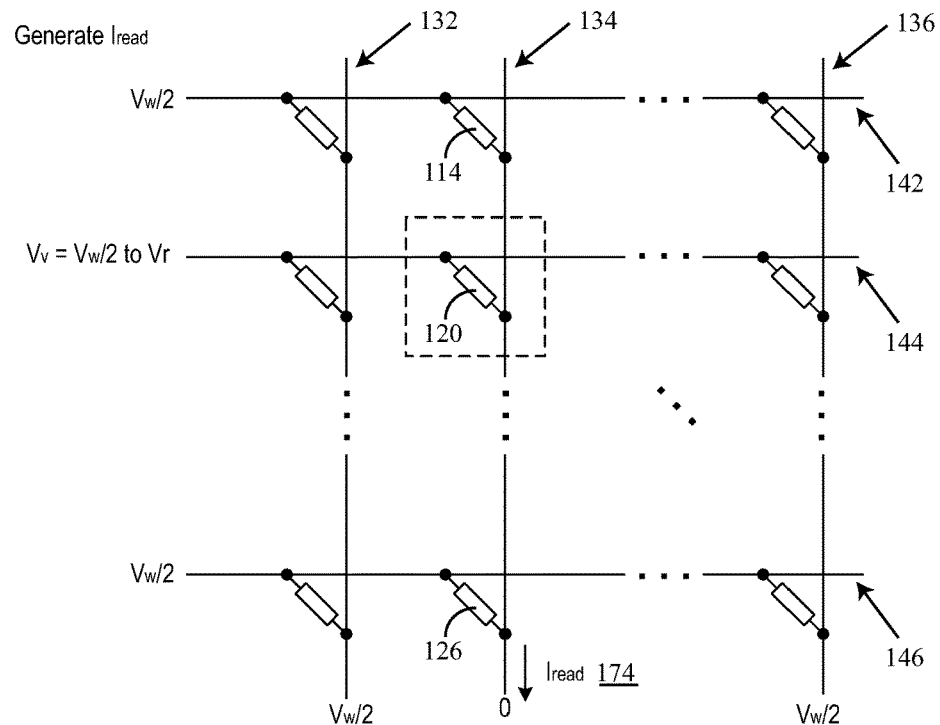
FIG. 4 is a diagram illustrating voltages applied to the crossbar array of FIG. 1-1 or 1-2 to generate an access current through a fully selected memory cell and partially selected memory cells connected to a bitline in examples of the present disclosure.

FIG. 4 is a diagram illustrating voltages applied to crossbar array 100-1 or 1-2 (FIG. 1-1 or 1-2) to generate first read current ($I_{read}$) 174 in a read operation in examples of the present disclosure. Variable voltage $V_v$ is applied to wordline 144 and bitline 134 is grounded while all other wordlines 142, 146, etc. and bitlines 132, 136, etc. are set to partial select voltage $V_w/2$. As a result an incrementing voltage drop across fully selected memory cell 120 and a $V_w/2$ voltage drop across partially selected memory cells 114, 126, etc. cause first read current 174 to flow from bitline 134. Note that "partially selected" means a memory cell experiencing a potential less than the threshold voltage $V_{th}$ of the selector in the memory cell and "fully selected" means a memory cell experiencing potential greater than the threshold voltage $V_{th}$ of the selector in the memory cell.

Referring to FIG. 1-1 or 1-2, first cell current 176 is determined as follows. Subtraction circuit 166 subtracts sneak current 172 associated with memory cell 120 in bitline 134 from first access current 174 of bitline 134 as it increments and outputs first cell current 176 of fully selected memory cell 120.

In a read operation, detection circuit 182 compares first cell current 176 against (read) reference current 178 and generates output signal 184 that represents the logical state of fully selected memory cell 120 based on the comparison.

In a write operation, the fully selected memory cell 120 may be reset as follows. Variable voltage $V_v$ applied to wordline 144 is ramped up to write voltage $V_w$ and bitline 134 is grounded while all other bitlines 132, 136, etc. and wordlines 142, 146, etc. are set to partial select voltage $V_w/2$. Detection circuit 182 compares first cell current 176 against (write) reference current 178 and generates output signal 184 when first cell current 176 reaches reference current 178. Control logic 192 receives trigger signal 184 and holds variable voltage $V_v$ applied to fully selected memory cell 120 constant for a time period until fully selected memory cell 120 is reset.

In a write operation, the fully selected memory cell 120 may be set as follows. Variable voltage $V_v$ applied to bitline 134 is ramped up to write voltage $V_w$ and wordline 144 is grounded while all other bitlines 132, 136, etc. and wordlines 142, 146, etc. are set to partial select voltage $V_w/2$. Similar to sensing circuit 152 connected to bitline selector 130, a sensing circuit is connected to wordline selector 140 to generate an output signal when a first cell current reaches a (write) reference current. Control logic 192 receives output signal 184 and holds variable voltage $V_v$ applied to fully selected memory cell 120 constant for a time period until fully selected memory cell 120 is set.

Referring back to FIG. 2, block 204 may be followed by block 206.

In block 206, another cell current flowing across another fully selected memory cell connected to the same bitline 134 or another bitline proximate to first bitline 134 is determined or estimated. In the example reusing sneak current across bitlines, another cell current 176 (FIG. 1-1 or 1-2) flowing across fully selected memory cell 124 connected to bitline 132 (FIG. 1-1 or 1-2) is determined or estimated. This determined or estimated cell current 176 is hereafter referred to as a "second cell current 176." Second cell current 176 is based on sneak current 172 (FIG. 1-1 or 1-2) associated with memory cell 120 and another access current 174 (FIG. 1-1 or 1-2) flowing through fully selected memory cell 124 (FIG. 1-1 or 1-2) and partially selected memory cells 112, 118, etc. (FIG. 1-1 or 1-2) connected to bitline 132 (FIG. 1-1 or 1-2). This access current 174 is hereafter referred to as a "second access current 174." Second access current 174 may be referred to as a "second read current 174" in a read operation or a "second write current 174" in a write operation. Note that blocks 204 and 206 may be different access types, such as a read followed by a write or a write followed by a read.

Second read current 174 in another read operation may be created in a similar manner as first read access current 174 previously described in reference to FIG. 4. Second cell current 176 may be determined from sneak current 172 and second read current 174 in a similar manner as first cell current 176 previously described in reference to FIG. 1-1 or 1-2.

In a read operation, the state of fully selected memory cell 124 may be determined in a similar manner as fully selected memory cell 120 previously described in reference to FIG. 1-1 or 1-2. In a write operation, the fully selected memory cell 124 may be set or reset in a similar manner as fully selected memory cell 120 previously described.

In the example reusing the same sneak current across rows that share the same bitline, a second cell current 176 (FIG. 1-1 or 1-2) flowing across fully selected memory cell 126 (FIG. 1-1 or 1-2) connected to bitline 134 (FIG. 1-1 or 1-2) is determined or estimated. An access current 174 of memory cell 126 is sensed as described above for memory cell 124, and sneak current 172 associated with memory cell 120 is subtracted from access current 174 of memory cell 126 to determine or estimate second cell current 176 of memory cell 126. Second cell current 176 may be used to read or write (set or reset) memory cell 126 as described above for memory cell 120.

Figure 5:
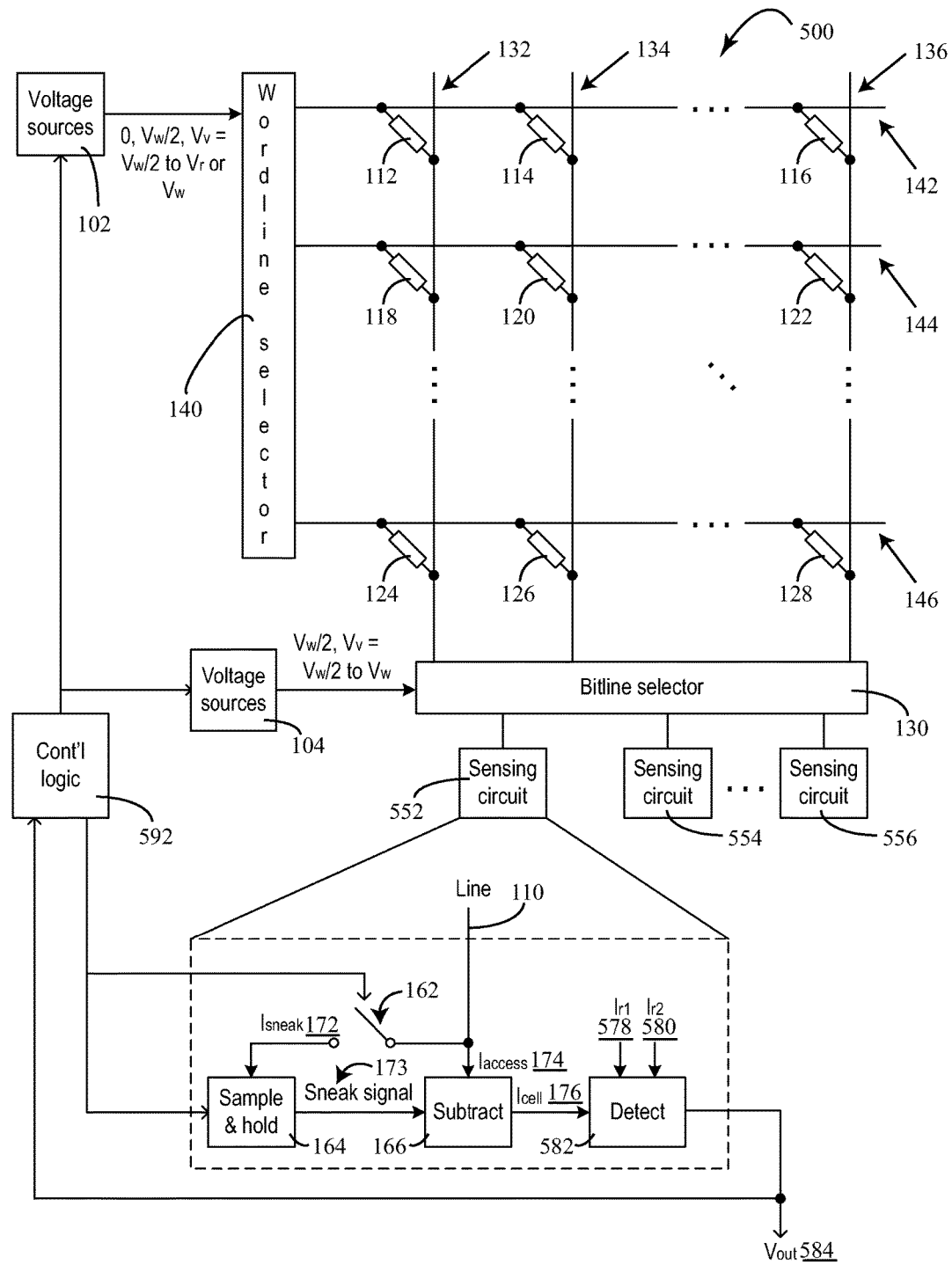
FIG. 5 is a diagram of a crossbar array in examples of the present disclosure.

FIG. 5 is a diagram of a crossbar array 500 in examples of the present disclosure. Crossbar array 500 is similar to crossbar array 100-2 (FIG. 1-2) except sensing circuits 152, 154, 156, etc. (FIG. 1-2) are replaced by sensing circuits 552, 554, 556, etc. Sensing circuit 552 is shown in greater detail in an enlarged view with other sensing circuits 554, 556, etc. being similarly constructed. Sensing circuit 552 is similar to sensing circuit 152 (FIG. 1-1 or 1-2) except detection circuit 182 (FIG. 1-1 or 1-2) is replaced by detection circuit 582. Detection circuit 582 is coupled to receive cell current 176 from subtraction circuit 166, first reference current $(I_{r1})$ 578 from a first reference current source, and second reference current $(I_{r2})$ 580 from a second reference current source.

In a read operation, controller logic 592 causes detection circuit 582 to sense a cell current. In response detection circuit 582 detects when a cell current reaches a first reference current 578 and when the cell current reaches a second reference current 580, and generates output signal 584 based on these two events. Reference currents 578 and 580 may be read reference currents in a read operation. In some examples of a read operation, the difference in the values of variable voltage $V_v$ applied across a fully selected memory cell at these two events is compared with a reference voltage to determine the state of the fully selected memory cell. The value of variable voltage $V_v$ sensed at the first event is hereafter referred to as a "cell first voltage $V_1$," and the value of variable voltage $V_v$ sensed at the second event is hereafter referred to as a "cell second voltage $V_2$." A determination of the memory cell state using cell first voltage $V_1$ and cell second voltage $V_2$ may be more accurate when the memory cells are non-linear resistive elements with readily distinguishable slopes in the voltage to current curve at different resistances. In other examples, the time difference of these two events is compared with a reference time to determine the state of the fully selected memory cell.

Figure 6:
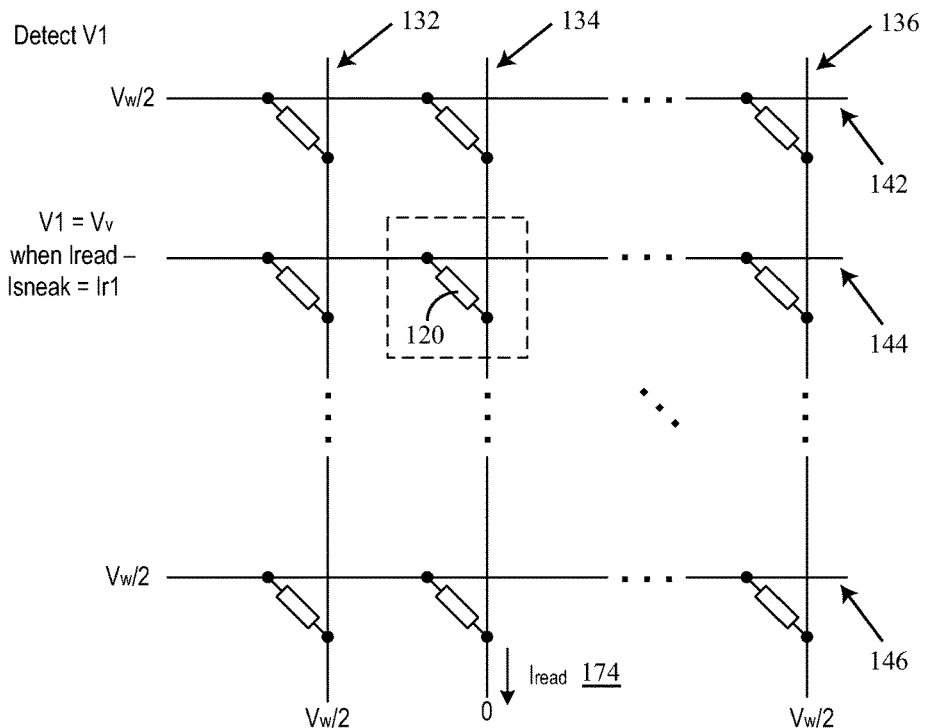
FIG. 6 is a diagram illustrating voltages applied to the crossbar array of FIG. 5 to generate a first cell current across a fully selected memory cell that is equal to a first reference current in a read operation in examples of the present disclosure.

In a write operation, detection circuit 582 detects when a cell current reaches first reference current $(I_{ref1})$ 578, and generates an output signal 584 based on this events. Reference current 578 may be a write reference currents in a write operation FIG. 6 illustrates voltages applied to crossbar array 500 (FIG. 5) to detect cell first voltage $V_1$ at the first event, which is the value of $V_v$ when cell current 176 (FIG. 5) is equal to first reference current 578 (FIG. 5) in a read or write operation, in examples of the present disclosure. Bitline 134 is grounded, wordline 144 is set to variable voltage $V_v$, and other wordlines 142, 146, etc. and other bitlines 132, 136, etc. are set to partial select voltage $V_w/2$. As a result read current $(I_{read})$ 174 flows from bitline 134 and variable voltage $V_v$ is at cell first voltage $V_1$ when cell current 176 reaches first (read) reference current 578.

Figure 7:
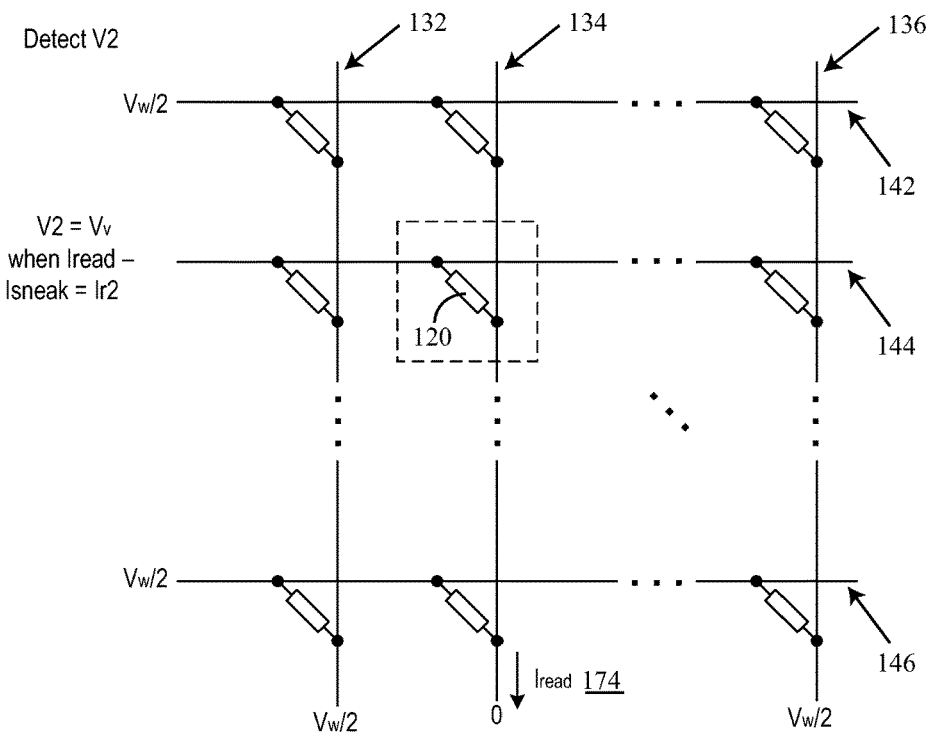
FIG. 7 is a diagram illustrating voltages applied to the crossbar array of FIG. 5 to generate a second cell current across a fully selected memory cell that is equal to a second reference current in a read operation in examples of the present disclosure.

FIG. 7 illustrates voltages applied to crossbar array 500 (FIG. 5) to detect cell second voltage $V_2$ at the second event, which is the value of $V_v$ when cell current 176 (FIG. 5) across a fully selected memory cell 120 is equal to second reference current 580 (FIG. 5) in a read operation, in examples of the present disclosure. Bitline 134 is grounded, wordline 144 is set to variable voltage $V_v$, and other wordlines 142, 146, etc. and other bitlines 132, 136, etc. are set to partial select voltage $V_w/2$. As a result read current $(I_{read})$ 174 flows from bitline 134 and variable voltage $V_v$ is at cell second voltage $V_2$ when cell current 176 reaches second reference current 580.

Figure 8:
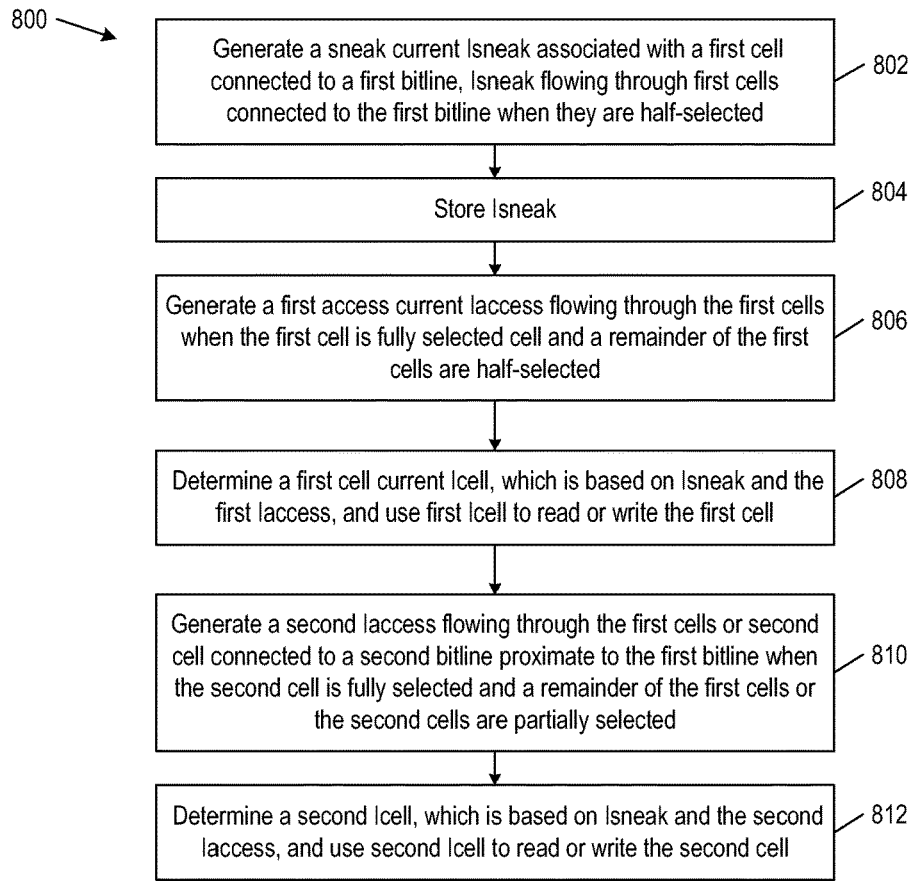
FIG. 8 is a flowchart of a method to access two memory cells connected to the same bitline or different but proximate bitlines in the crossbar array of FIG. 5 by reusing the sneak current from one bitline in examples of the present disclosure.

FIG. 8 is a flowchart of a method 800 to access two memory cells connected to the same bitline or different but proximate bitlines in crossbar array 500 (FIG. 5) by reusing the sneak current from one bitline in examples of the present disclosure. To illustrate method 800 reusing the same sneak current across bitlines, assume memory cell 120 (FIG. 5)

connected to bitline 134 (FIG. 5) is accessed before memory cell 124 (FIG. 5) connected to bitline 132 (FIG. 5). To illustrate method 800 reusing the same sneak current across rows that share the same bitline, assume memory cell 120 connected to bitline 134 (FIG. 1-1 or 1-2) is accessed before memory cell 126 (FIG. 1-1 or 1-2) connected to the same bitline 134. Method 800 may begin in block 802.

In block 802, sneak current 172 (FIG. 5) associated with memory cell 120 (FIG. 5) is generated. Sneak current 172 flows through partially selected memory cells 114, 120 . . . 126 (FIG. 5) connected to bitline 134 (FIG. 5). Sneak current 172 may be generated as similarly described above in reference to FIG. 3. Block 802 may be followed by block 804.

In block 804, sneak current 172 (FIG. 5) is stored. Referring to FIG. 5, control logic 592 causes switch 162 to couple sample and hold circuit 164 to line 110, which is coupled by bitline selector 130 to bitline 134. Sample and hold circuit 164 then stores sneak current 172 from bitline 134. Block 804 corresponds to the previously described block 202. Referring back to FIG. 8, block 804 may be followed by block 806.

In block 806, first access current 174 (FIG. 5) is generated. First access current 174 flows through fully selected memory cell 120 (FIG. 5) and partially selected memory cells 114, 126, etc. (FIG. 5) connected to bitline 134. First access current 174 may be first read current 174 in a read operation or first write current 174 in a write operation. First access current 174 may be generated as similar described above in reference to FIG. 4. Block 806 corresponds to part of the previously described block 204. Block 806 may be followed by block 808.

In block 808, first cell current 176 (FIG. 5) flowing across fully selected memory cell 120 (FIG. 5) is determined or estimated. First cell current 176 is based on sneak current 172 (FIG. 1) associated with memory cell 120 and first access current 174 (FIG. 5). In some examples, first cell current 176 is equal to subtracting sneak current 172 of bitline 134 from first access current 174. First cell current 176 may be used to determine the state of fully selected memory cell 120 or write fully selected memory cell 120. One way of determining the state of fully selected memory cell 120 based on first cell current 176 is described later in reference to FIG. 9. One way of writing fully selected memory cell 120 based on first cell current is described later in reference to FIG. 10. Block 808 corresponds to part of the previously described block 204. Block 808 may be followed by block 810.

In block 810, second access current 174 (FIG. 5) is generated. In the example reusing sneak current across bitlines, second access current 174 flows through fully selected memory cell 124 (FIG. 5) and partially selected memory cells 112, 118, etc. (FIG. 5) connected to bitline 132. In the example reusing sneak current across rows sharing the same bitline, second access current 174 flows through fully selected memory cell 126 (FIG. 5) and partially selected memory cells 114, 120 . . . . Second access current 174 may be second read current 174 in a read operation or second write current 174 in a write operation. Second access current 174 may be generated as similar described above in reference to FIG. 4. Block 810 corresponds to part of the previously described block 206. Block 810 may be followed by block 812.

In block 812, second cell current flowing across another fully selected memory cell connected to bitline 134 or another bitline proximate to first bitline 134 is determined or estimated. In the example reusing sneak current across bitlines, second cell current 176 (FIG. 5) flowing across fully selected memory cell 124 (FIG. 5) is determined or estimated. In the example reusing sneak current across rows sharing the same bitline, second cell current 174 flowing across fully selected memory cell 126 (FIG. 5) is determined or estimated. Second cell current 176 is based on sneak current 172 (FIG. 1) associated with memory cell 120 and second access current 174 (FIG. 5). In some examples, second cell current 176 is equal to subtracting sneak current 172 from second access current 174. Second cell current 176 may be used to determine the state of fully selected memory cell 124 or to write fully selected memory cell 124. Note that blocks 806 and 808 may be a different access type than blocks 810 and 812, such as a read followed by a write or a write followed by a read. One way of determining the state of fully selected memory cell 124 based on second cell current 176 is described later in reference to FIG. 9. One way of writing fully selected memory cell 124 based on second cell current is described later in reference to FIG. 10. Block 812 corresponds to part of the previously described block 206.

Figure 9:
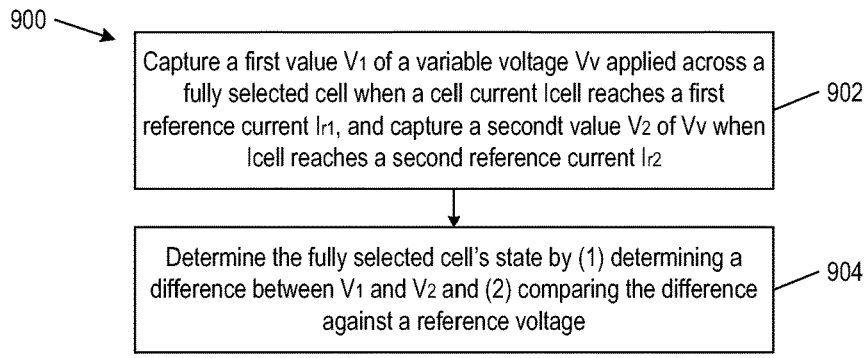
FIG. 9 is a flowchart of a block in the method of FIG. 8 to determine a memory cell's state in a read operation in examples of the present disclosure.

FIG. 9 is a flowchart of a method 900 to implement block 808 or 812 (FIG. 8) of method 800 (FIG. 8) to determine a fully selected memory cell's state in a read operation in examples of the present disclosure. Method 900 may begin in block 902.

In block 902, detection circuit 582 captures the value of variable voltage $V_v$ applied across a fully selected memory cell at cell first voltage $V_1$ when cell current 176 (FIG. 5) across the fully selected memory cell reaches first (read) reference current 578 (FIG. 5). Detection circuit 582 then captures variable voltage $V_v$ applied across the fully selected memory cell at cell second voltage $V_2$ when cell current 176 (FIG. 5) across the fully selected memory cell reaches second (read) reference current 580 (FIG. 5). As described before, reference currents 578 and 580 may be read reference currents in a read operation. Block 902 may be followed by block 904.

In block 904, detection circuit 582 determines the state of the fully selected memory cell by determining (1) a difference between cell first voltage $V_1$ and cell second voltage $V_2$ and (2) comparing the difference against a reference voltage.

Figure 10:
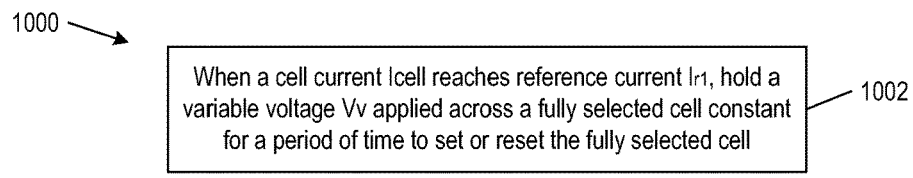
FIG. 10 is a flowchart of a block in the method of FIG. 8 to set or reset a memory cell in a write operation in examples of the present disclosure.

FIG. 10 is a flowchart of a method 1000 to implement block 808 or 812 (FIG. 8) of method 800 (FIG. 8) to write (set or reset) a fully selected memory cell in examples of the present disclosure. As described above, the currents and voltages are transposed for the bitlines and the wordlines between set and reset operations. Method 1000 may begin in block 1002.

In block 1002, control logic 592 receives output signal 584 and holds variable voltage $V_v$ applied to the fully selected memory cell constant for a time period until the fully selected memory cell is set or reset. As described before, reference current 578 may be a write reference current. Detection circuit 582 compares cell current 176 against write reference current 578 to generate output signal 584 when cell current 176 reaches write reference current 578.

Figure 11:
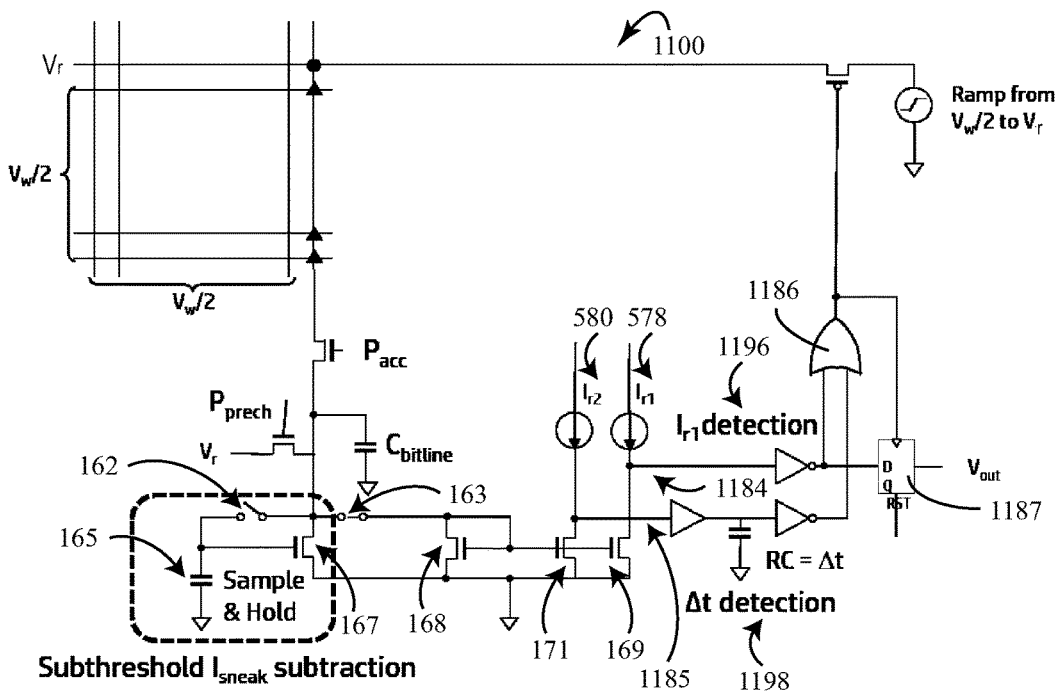
FIG. 11 is a circuit schematic of a sensing circuit of FIG. 5 in examples of the present disclosure.

FIG. 11 is a circuit schematic of a sensing circuit 1100 in examples of the present disclosure. Sensing circuit 1100 is similar to sensing circuit 152 of FIG. 1-3 except reference current 178 is replaced by a first reference current 578 (FIG. 5), and the current mirror includes an additional branch having a third FET 171 with its gate connected to the drain of first FET 168 and its drain connected to a reference current source providing a second reference current 580. Sensing circuit 1100 also includes a current detection circuit 1196 and a delta-time detection circuit 1198. A sneak current 172 (FIG. 1-3) is sensed as in sensing circuit 152 of FIG. 1-3. A cell current 176 (FIG. 1-3) is sensed to turn on second FET 169 when cell current 176 reaches first reference current ($I_{r1}$) 578 and generate a first trigger signal 1184 as in sensing circuit 152 of FIG. 1-3. Cell current 176 further turns on third FET 171 when cell current reaches second reference current ($F_{r2}$) 580 and generates a second trigger signal 1185. Trigger signals 1184 and 1185 are inverted and provided to an OR gate 1186 used to turn on and then off a variable voltage source providing variable voltage $V_v$ from $V_w/2$ to Vr. First trigger signal 1184 is also provided as a data signal to a flip-flop 1187 while the output of the OR gate 1186 is provided as a clock signal to the flip-flop 1187 to generate a logic signal $V_{out}$ for which a logic high value indicates that the time difference between cell current 176 going from first reference current 578 to second reference current 580 is below a threshold of roughly At, which should be the case if the selected cell is in a low resistance state. A low logic value would indicate that the cell is in a high resistance state.

Figure 12:
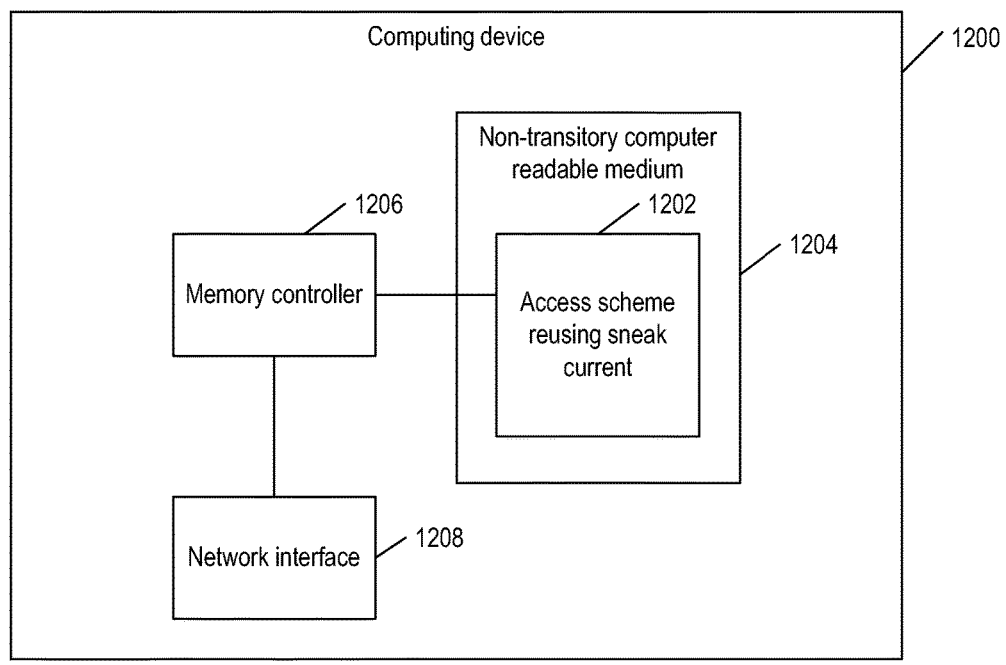
FIG. 12 is a block diagram of a computing device for implementing the control logic of FIGS. 1-1, 1-2, or 5 in examples of the present disclosure.

FIG. 12 is a block diagram of a computing device 1200 for implementing control logic 192 of FIG. 1-1, 1-2 or control logic 592 of FIG. 5 in examples of the present disclosure. Instructions 1202 for crossbar array 100-1 of FIG. 1-1, crossbar array 100-2 of FIG. 1-2, or crossbar array 500 of FIG. 5 that implement an access scheme reusing sneak current are stored in a non-transitory computer readable medium 1204, such as a read-only memory. A memory controller 1206 executes instructions 1202 to provide the described features and functionalities. Memory controller 1206 communicates with sensing circuits 152, 154, 156, etc. or sensing circuits 552, 554, 556, etc., and voltage sources 102 of FIG. 1-1, 1-2, 1-3, or 5 via a network interface 1208. In examples of the present disclosure, control logic 192 may be implemented by a finite state machine or the circuit of FIG. 11.

Various other adaptations and combinations of features of the examples disclosed are within the scope of the invention.

What is claimed is:

1. A method to access memory cells in a crossbar array, comprising:
   performing a first access operation to a first memory cell connected to a first bitline, comprising:
      storing a sneak current associated with the first memory cell, the sneak current flowing through first memory cells connected to the first bitline when the first memory cells are partially selected; and
      after storing the sneak current, determining a first cell current flowing through the first memory cell when the first memory cell is fully selected, wherein the first cell current is based on the sneak current and a first access current flowing through the first memory cells when the first memory cell is fully selected and a remainder of the first memory cells are partially selected; and
   performing a second access operation to a second memory cell connected to the first bitline or a second bitline proximate to the first bitline, comprising:
      determining a second cell current flowing through the second memory cell when the second memory cell is fully selected, wherein the second cell current is based on the sneak current and a second access current flowing through the first memory cells or second memory cells connected to the second bitline when the second memory cell is fully selected and a remainder of the first memory cells or the second memory cells are partially selected.

2. The method of claim 1, wherein the second bitline is proximate to the first bitline when they are both selectively coupled to a same sensing circuit.

3. The method of claim 1, wherein the first cell current comprises subtracting the sneak current from the first access current, and the second cell current comprises subtracting the sneak current from the second access current.

4. The method of claim 1, wherein the first access operation is a read operation comprising:
   sensing a cell first voltage applied across the first memory cell when the first cell current through the memory cell reaches a first reference current;
   sensing a cell second voltage applied across the first memory cell when the first cell current reaches a second reference current; and
   comparing a difference between the cell first and second voltages against a reference voltage, wherein the first memory cell is determined to be in one state when the difference is greater than the reference voltage and the memory cell is determined to be in another state when the difference is less than the reference voltage.

5. The method of claim 1, wherein the first access operation is a write operation comprising holding a variable voltage applied to the first memory cell constant for a time period to write the first memory cell when the first cell current reaches a reference current.

6. The method of claim 1, wherein the memory cells comprise memristor cells.

7. The method of claim 1, further comprising:
   generating the sneak current by providing a partial select voltage across the first memory cells connected to the first bitline;
   generating the first access current by providing a variable voltage across the first memory cell and the partial select voltage across the remainder of the first memory cells; and
   generating the second access current by providing the variable voltage across the second memory cell and the partial select voltage across the remainder of the second memory cells.

8. An apparatus, comprising:
   a crossbar array comprising memory cells at crossing points between wordlines and bitlines;
   a wordline selector selectively coupling the wordlines to a partial select voltage and a variable voltage;
   a bitline selector selectively coupling the bitlines to the partial select voltage and ground;
   a sensing circuit coupled to a bitline, comprising:
      a sample and hold circuit to store a sneak current from the bitline;
      a subtraction circuit coupled to (1) the bitline to receive an access current of a memory cell in the bitline and (2) the sample and hold circuit to receive the sneak current, the subtraction circuit outputting a cell current of the memory cell by subtracting from the access current;
      a switch selectively coupling the bitline to the sample and hold circuit; and
      a detection circuit to generate an output signal based on when the cell current reaches a reference current; and
   a control logic configured to:
      perform a first access operation to a first memory cell in the bitline, comprising:
         causing the switch to couple the bitline to the sample and hold circuit to store a first sneak current associated with the first memory cell, wherein the subtraction circuit outputs a first cell current of the first memory cell in the bitline by subtracting the sneak current from a first access current from the bitline, and the detection circuit generates a first output signal based on when the first cell current reaches the reference current; and perform a second access operation to a second memory cell in the bitline without storing a second sneak current associated with the second memory cell in the sample and hold circuit, wherein the subtraction circuit outputs a second cell current of the second memory cell in the bitline by subtracting the sneak current from a second access current from the bitline, and the detection circuit generates a second output signal based on when the second cell current reaches the reference current.

9. The apparatus of claim 8, wherein the detection circuit is further coupled to receive another reference current, the detection circuit further generates the output signal based on when the cell current reaches the other reference current.

10. The apparatus of claim 9, wherein the first access operation is a read operation comprising:

sensing a cell first voltage applied across the first memory cell when the first cell current through the memory cell reaches the reference current;

sensing a cell second voltage applied across the first memory cell when the first cell current reaches the other reference current; and comparing a difference between the cell first voltage the cell second voltages against a reference voltage, wherein the first memory cell is determined to be in one state when the difference is greater than the reference voltage and the memory cell is determined to be in another state when the difference is less than the reference voltage.

11. The apparatus of claim 8, wherein the first and the second operations are write operations, and the control logic holds the variable voltage applied across the first memory cell constant for a time period to write the memory cell after the control logic receives the output signal.

12. The apparatus of claim 8, wherein the second bitline is proximate to the first bitline because they are both selectively coupled by the bitline selector to the same sensing circuit.

13. The apparatus of claim 8, wherein the memory cells comprise memristor cells.

14. A non-transitory computer-readable medium encoded with instructions executable by a memory controller to:

perform a first access operation, comprising determining a first cell current flowing through a first memory cell connected to a bitline by subtracting a sneak current associated with the first memory cell from a first access current of the first memory cell, the sneak current flowing through the first memory cell when the first memory cell is partially selected; and perform a second access operation, comprising determining a second cell current flowing through a second memory cell connected to the bitline by subtracting the sneak current from a second access current of the second memory cell.

15. The non-transitory computer-readable medium of claim 14, further comprising instructions executable by a memory controller to:

perform a third access operation, comprising determining a third cell current flowing across a third memory cell connected to another bitline by subtracting the sneak current from a third access current of the third memory cell.

16. The non-transitory computer-readable medium of claim 14, wherein the second access operation is performed when the second cell is fully selected.

17. The non-transitory computer-readable medium of claim 14, wherein the first access operation is a read operation.

18. The non-transitory computer-readable medium of claim 14, wherein the first access operation is a write operation.

19. The non-transitory computer-readable medium of claim 14, wherein the memory controller communicates with a plurality of sensing circuits and voltage sources via a network interface.

20. The non-transitory computer-readable medium of claim 15, wherein the first, second and third memory cells comprise memristor cells.

* * * * *